US008535553B2

(12) United States Patent
Kong et al.

(10) Patent No.: US 8,535,553 B2
(45) Date of Patent: Sep. 17, 2013

(54) LARGE-AREA SINGLE- AND FEW-LAYER GRAPHENE ON ARBITRARY SUBSTRATES

(75) Inventors: Jing Kong, Winchester, MA (US); Alfonso Reina Cecco, Cambridge, MA (US); Mildred S. Dresselhaus, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 797 days.

(21) Appl. No.: 12/422,747

(22) Filed: Apr. 13, 2009

(65) Prior Publication Data

US 2010/0021708 A1     Jan. 28, 2010

Related U.S. Application Data

(60) Provisional application No. 61/044,569, filed on Apr. 14, 2008.

(51) Int. Cl.
*C03C 15/00*     (2006.01)
*C03C 25/68*     (2006.01)

(52) U.S. Cl.
USPC ............................................. 216/95; 216/83

(58) Field of Classification Search
None
See application file for complete search history.

(56) References Cited

U.S. PATENT DOCUMENTS

| | | | |
|---|---|---|---|
| 7,071,258 B1 | 7/2006 | Jang et al. | |
| 7,767,615 B2 * | 8/2010 | Kinloch et al. | 502/185 |
| 2005/0271574 A1 | 12/2005 | Jang et al. | |
| 2008/0061477 A1 * | 3/2008 | Capizzo | 264/402 |
| 2009/0199960 A1 * | 8/2009 | Nuzzo et al. | 156/230 |

FOREIGN PATENT DOCUMENTS

| | | | |
|---|---|---|---|
| EP | 1840648 A1 | * | 10/2007 |
| JP | 15-081699 A | | 3/2003 |

OTHER PUBLICATIONS

Meyer et al. "The structure of suspended graphene sheets" Nature, Mar. 2007, vol. 446, p. 60-63 and Supplementary Information p. 1-5.*
Wang et al. "Free-standing subnanometer graphite sheets" Appl. Phys. Lett. 2004, vol. 85, No. 7, p. 1265-1267.*
Oshima et al. "Ultra-thin epitaxial films of graphite and hexagonal boron nitride on solid surfaces" J. Phys.: Condens. Matter 1997, vol. 9, p. 1-20.*
Laplaze et al. "Carbon nanotubes: dynamics of synthesis process" Carbon 2002, vol. 40, p. 1621-1634.*

(Continued)

*Primary Examiner* — Shamim Ahmed
*Assistant Examiner* — Bradford Gates
(74) *Attorney, Agent, or Firm* — Modern Times Legal; Robert J. Sayre

(57) ABSTRACT

A film of single-layer to few-layer graphene is formed by depositing a graphene film via chemical vapor deposition on a surface of a growth substrate. The surface on which the graphene is deposited can be a polycrystalline nickel film, which is deposited by evaporation on a $SiO_2$/Si substrate. A protective support layer is then coated on the graphene film to provide support for the graphene film and to maintain its integrity when it is removed from the growth substrate. The surface of the growth substrate is then etched to release the graphene film and the protective support layer from the growth substrate, wherein the protective support layer maintains the integrity of the graphene film during and after its release from the growth substrate. After being released from the growth substrate, the graphene film and protective support layer can be applied onto an arbitrary target substrate for evaluation or use in any of a wide variety of applications.

28 Claims, 15 Drawing Sheets

(56) References Cited

OTHER PUBLICATIONS

Wang et al. "Synthesis and characterization of MWNTs with narrow diameter over nickel catalyst by MPCVD" Scripta Materialia 2003, vol. 48, p. 409-412.*

Zhou et al. "A molecular dynamics study of nickel vapor deposition: temperature, incident angle, and adatom energy effects" Acta Matter. 1997, vol. 45, No. 4, p. 1513-1524.*

Miyake et al. "Electronic structure of potassium-doped carbon nanotubes" Physical Review B, Apr. 2002, vol. 65, p. 165419.*

Berger, Claire, et al., "Electronic Confinement and Coherence in Patterned Epitaxial Graphene", Science 312, 1191-96 (May 26, 2006).

Berger, Claire, et al., "Ultrathin Epitaxial Graphite: 2D Electron Gas Properties and a Route Toward Graphene-Based Nanoelectronics", J. Phys. Chem. B 108 (52), 19912-16 (Dec. 3, 2004).

Bhaviripudi, Sreekar, et al., "Block-Copolymer Assisted Synthesis of Arrays of Metal Nanoparticles and Their Catalytic Activities for the Growth of SWNTs", Nanotechnology 17, 5080-86 (Sep. 22, 2006).

Blake, Peter, et al., "Graphene-Based Liquid Crystal Device", Nano Letters (online) (Apr. 30, 2008).

Carel, R., et al., "Computer Simulation of Strain Energy Effects vs. Surface and Interface Energy Effects on Grain Growth in Thin Films", Acta Materialia, 44 (6), 2479-2494 (1996).

Dato, Alberto, et al., "Substrate-Free Gas-Phase Synthesis of Graphene Sheets", Nano Letters 8 (7), 2012-16 (Jun. 5, 2008).

Eda, Goki, et al., "Large-Area Ultrathin Films of Reduced Graphene Oxide as a Transparent and Flexible Electronic Material", Nature Nanotechnology (Advance Online Publication) (Apr. 6, 2008).

Fujita, D., et al., "Surface Precipitation of Graphite Layers on Carbon-Doped Nickel and Their Stabilization Effect Against Chemisorption and Initial Oxidation", Surface and Interface Analysis 19, 430-434 (1992).

Gamo, Y., et al., "Atomic Structure of Monolayer Graphite Formed on Ni(111)", Surface Sciences 374, 61-64 (1997).

Hata, Kenji, et al., "Water-Assisted Highly Efficient Synthesis of Impurity-Free Single-Walled Carbon Nanotubes", Science 306, 1362-64 (Nov. 19, 2004).

Hernandez, Yenny, et al., "High-Yield Production of Graphene by Liquid-Phase Exfoliation of Graphite", Nature Nanotechnology 3, 563-68 (Aug. 10, 2008).

Johansson, Ann-Sofie, et al., "TEM Investigation of CVD Graphite on Nickel", Thin Solid Films 252, 19-25 (1994).

Kawano, Takanori, et al., "Preparation of Layered B/C/N Thin Films on Nickel Single Crystal by LPCVD", Solid State Sciences 4, 1521-27 (2002).

Kim, K.S., et al., "Large-Scale Pattern Growth of Graphene Films for Stretchable Transparent Electrodes", Nature 2457 (7230), 706-710 (2009).

Kong, Jing, et al., "Synthesis of Individual Single-Walled Carbon Nanotubes on Patterned Silicon Wafers", Nature 35, 878-881 (Oct. 29, 1998).

Li, Dan, et al., "Processable Aqueous Dispersions of Graphene Nanosheets", Nature Nanotechnology 3, 101-105 (Jan. 27, 2008).

Li, Xiaolin, et al., "Highly Conducting Graphene Sheets and Langmuir-Blodgett Films", Nature Nanotechnology 3, 538-542 (Aug. 1, 2008).

Li, Xuesong, et al., "Large-Area Synthesis of High-Quality and Uniform Graphene Films on Copper Foils", Science Express (May 7, 2009).

Li, Xuesong, et al., "Supporting Online Material for Large-Area Synthesis of High-Quality and Uniform Graphene Films on Copper Foils", Science Express (May 7, 2009).

Muradov, N. Z., "How to Produce Hydrogen from Fossil Fuels Without $CO_2$ Emission", Int. J. Hydrogen Energy 18 (3), 211-15 (1993).

Novoselov, K. S., et al., "Two-Dimensional Atomic Crystals", PNAS 102, 10451-53 (Jul. 18, 2005).

Obraztsov, A. N., et al., "Chemical Vapor Deposition of Thin Graphite Films of Nanometer Thickness", Carbon 45, 2017-2021 (Jun. 24, 2007).

Pan, Y., et al., "Millimeter-Scale, Highly Ordered Single Crystalline Graphene Grown on Ru (0001) Surface", arxiv.org <http://arxiv.org/ftp/arxiv/papers/0709/0709.2858.pdf> (Sep. 2007).

Reina, A., et al., "Large Area, Few-Layer Graphene Films on Arbitrary Substrates by Chemical Vapor Deposition", Nano Letters 9 (1), 30-35 (Dec. 1, 2008).

Shelton, J. C., et al., "Equilibrium Segregation of Carbon to a Nickel Surface: A Surface Phase Transition", Surface Science 43, 493-520 (1974).

Shikin, A. M., et al., "Surface Phonon Dispersion of a Graphite Monolayer Adsorbed on Ni(111) and its Modification Caused by Intercalation of Yb, La and Cu Layers", Surface Sciences 424, 155-167 (1999).

Somani, Prakash R., et al., "Planer Nano-Graphenes from Camphor by CVD", Chemical Physics Letters, 56-59 (Jun. 30, 2006).

Stankovich, Sasha, et al., "Synthesis and Exfoliation of Isocyanate-Treated Graphene Oxide Nanoparticles", Carbon 44, 3342-47 (Aug. 4, 2006).

Stankovich, Sasha, et al., "Synthesis of Graphene-Based Nanosheets via Chemical Reduction of Exfoliated Graphite Oxide", Carbon 45, 1558-1565 (Mar. 6, 2007).

Starodubov, A. G., et al., "Intercalation of Silver Atoms under a Graphite Monolayer on Ni(111)", Physics of the Solid State 46 (7), 1340-48 (2004).

Sutter, Peter W., et al., "Epitaxial Graphene on Ruthenium", Nature Nanotechnology (Advance Online Publication) (Apr. 6, 2008).

Takenaka, Sakae, et al., "Methane Decomposition Into Hydrogen and Carbon Nanofibers Over Supported Pd-Ni Catalysts", Journal of Catalysis, 468-477, (2003).

Thompson, C.V., et al., "Grain Growth in Thin Films", Annual Review of Materials Science, 20 (1), 245-268 (1990).

Thompson, C.V., et al., "Stress and Grain Growth in Thin Films", Journal of the Mechanics and Physics of Solids, 44 (5), 657-673 (1996).

Worsley, Kimberly A., et al., "Soluble Graphene Derived from Graphite Fluoride", Chemical Physics Letters 445, 51-56, (Feb. 28, 2007).

Yi, Pan, et al., "Formation of Graphene on Ru(0001) Surface", Chinese Physics 16 (11) 3151-53, (Nov. 2007).

Yu, Q., et al., "Graphene Segregated on Ni Surfaces and Transferred to Insulators", Applied Physics Letters, 93 (11), 113103-3 (Sep. 15, 2008).

Korean Intellectual Property Office, PCT International Search Report and Written Opinion for PCT/US2009/040402 (corresponding PCT application), pp. 1-7.(Dec. 17, 2009).

Kim, Keun S., et al., "Large-scale pattern growth of graphene films for stretchable transparent electrodes", Nature, vol. 457, pp. 706-710 (pp. 1-5) (Feb. 5, 2009).

Q. Yu, et al., "Graphene Synthesis by Surface Segregation of Ni and Cu," <http://arxiv.org/vc/arxiv/papers/0804/0804.1778v1.pdf> (reported publication date: Apr. 10, 2008).

* cited by examiner

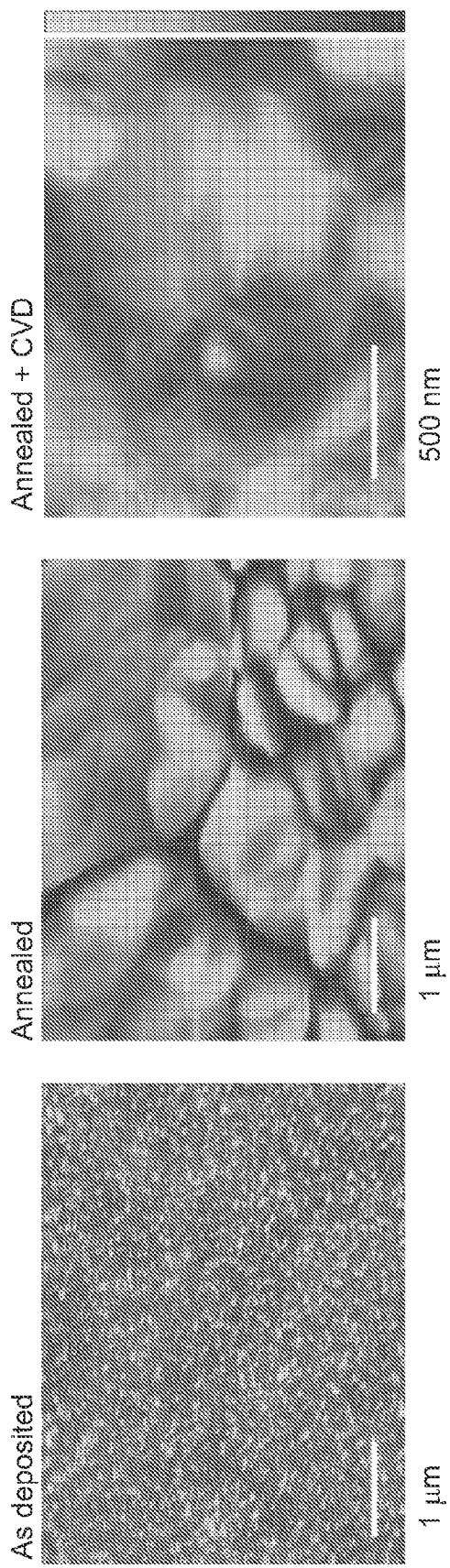

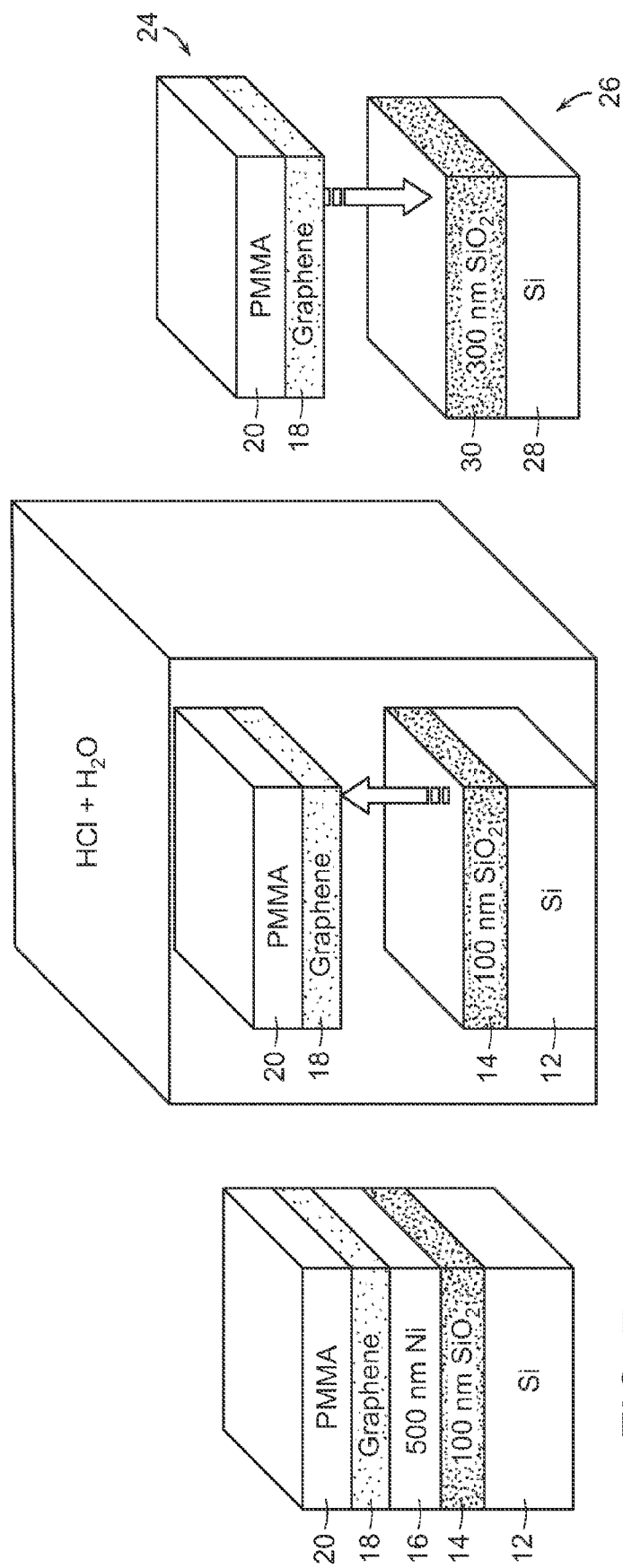

LARGE-AREA SINGLE- AND FEW-LAYER GRAPHENE ON ARBITRARY SUBSTRATES

RELATED APPLICATION

This application claims the benefit of U.S. Provisional Application No. 61/044,569, filed Apr. 14, 2008, the entire content of which is incorporated herein by reference.

GOVERNMENT SUPPORT

The invention was supported, in whole or in part, by a grant, FA 8721-05-C-0002, from the United States Air Force. The Government has certain rights in the invention.

BACKGROUND

The invention is related to the field of graphene and, in particular, to the synthesis and fabrication of large-area graphene films on arbitrary substrates (i.e., any of a wide variety of substrates) and the fabrication of patterned graphene structures based on the synthesis method.

In recent years, research on single- or few-layer graphene (SLG or FLG) has attracted much attention. "Graphene" refers to a single layer of hexagonal carbon structure. Single-layer-graphene and few-layer-graphene structures have been predicted and demonstrated to have many remarkable properties, such as high electron and hole mobilities with a symmetrical electron and hole band structure, high current-carrying capacity, high in-plane thermal conductivity, high tensile strength and high mechanical stability. When graphene is cut into narrow strips, it bears attributes very similar to those of carbon nanotubes, which have been investigated thoroughly. However, there are many hurdles for the application of nanotubes due to the challenges of controlling the nanotube structures, whereas graphene strips or other structures can be patterned by conventional top-down lithography methods, which can be advantageous. The observation of an unconventional quantum Hall effect in graphene has also been reported and can be seen even at room temperature. The linear E(k) relationship in the electronic band structure of graphene gives rise to an unusual massless Dirac fermion behavior of the electrons. The electrical conductance of graphene is also sensitive to the absorption or desorption of even a single gas molecule. Graphene sheets, accordingly, show great potential as another materials option for electronic applications (e.g., for electronic devices, sensors or composite materials).

Though single- and few-layer graphene offer such significant advantages, the current methods for achieving single- and few-layer graphene are very limited. Existing methods include high-temperature vacuum annealing of SiC single-crystal substrates, hydrocarbon decomposition on single crystal metal substrates under ultra high vacuum (UHV) conditions, or manually cleaving highly oriented pyrolytic graphite (HOPG) using adhesive tape on $SiO_2$ substrates. These methods are not well suited for large-scale manufacturing.

SUMMARY

Various embodiments of this invention, as characterized in the claims, may include some or all of the elements, features and steps described, below.

A graphene film composed of single-layers and few-layers is formed by doping a growth substrate with carbon via chemical vapor deposition. The graphene film grows by surface segregation of carbon during cooling of the growth substrate. A protective support layer is then coated on the graphene film to provide support for the graphene film and to maintain its integrity when the graphene film is removed from the growth substrate. The surface of the growth substrate is then etched to release the graphene film and protective support layer from the growth substrate. After being released from the growth substrate, the graphene film and protective support layer can be applied onto an arbitrary target substrate for evaluation or use in any of a wide variety of applications. The protective support layer can be removed from the graphene film after the graphene film is applied to the arbitrary substrate.

In a particular embodiment of the method, a nickel coating is deposited on a silica surface of a substrate, e.g., via electrochemical deposition, electron-beam evaporation or sputtering. The nickel coating can be polycrystalline. A graphene film is then grown via atmospheric chemical vapor deposition (e.g., chemical vapor deposition where the atmosphere is at a pressure slightly higher than atmospheric, i.e., greater than 101.325 kPa) on the nickel-coated substrate using methane as a source for carbon in the grown graphene film. The graphene film is then coated with polymethylmethacrylate serving as the protective support layer. The graphene film and polymethylmethacrylate are then released by etching the nickel coating with an aqueous hydrochloric acid solution. After release, the graphene film and polymethylmethacrylate are applied to an arbitrary substrate; and the polymethylmethacrylate is then removed.

According to one aspect of the invention, there is provided a single-layer or few-layer (i.e., 2-10 layer in most regions) graphene film on a substrate, such as silicon with a silicon dioxide surface layer ($Si/SiO_2$). The area of the graphene film (measured in a plane parallel to its interface with the substrate) can be 1-2 $cm^2$; and, in principle, there is no limitation on the size of the film that can be produced with the method disclosed herein. The thickness of the graphene film can be one layer to 10 graphene layers at most of the locations on the film. The graphene film can be polycrystalline with an estimated average single crystalline domain size of 0.5 $\mu m^2$ or higher.

In additional methods, the grain size of the nickel (or other metal) is increased by promoting growth of (111) grains via higher nickel deposition temperatures (e.g., with the substrate at elevated temperatures, such as 450° C.) to increase the thickness uniformity in the graphene film and to favor growth of single- and bi-layer graphene, as multi-layer graphene (i.e., graphene with a thickness greater than two layers) usually grows at the grain boundary regions. In additional embodiments of the methods, the fraction of the graphene film that is no more than two layers thick can be increased to about 60-87% or more by forming a nickel-carbon solid solution in the nickel layer at high temperatures and then slowly cooling (e.g., at a rate less than 25° C./minute) to control graphene precipitation and to decrease the number of nucleation sites of multilayer graphene on the film, thereby increasing the area covered by single- and bi-layer graphene.

The methods of this disclosure can produce high-quality single-layer to few-layer graphene using evaporated polycrystalline nickel films on a $Si/SiO_2$ substrate (or other substrate with a low surface roughness), though the surface of the nickel film used to grow the graphene can be polycrystalline or single crystalline. Furthermore, the films so produced can be easily transferred to any type of substrate (beyond, e.g., SiC or $SiO_2$); and selecting a substrate from among varying compositions provides means for controlling the electron mobility in the graphene film (i.e., different substrates may produce different electron mobilities). Even though regions of the graphene film may be only a monolayer in thickness, the film can be continuous across its entire area. In principle, there is no limitation to the size of the synthesized graphene film, which is determined by the area of the surface of the nickel film substrate (1-2 cm$^2$) on which it is grown in the present studies. From the structural characterization of these films using various tools, including High-Resolution Transmission Electron Microscopy (HRTEM), Atomic Force Microscopy (AFM), Raman spectroscopy, and X-ray diffraction (XRD), the samples were observed to have a high structural quality. These methods open up significant opportunities for the integration of graphene into electronic applications.

BRIEF DESCRIPTION OF THE DRAWINGS

FIG. 4 is an image of an as-deposited nickel film.

FIG. 5 is an image of that nickel film after annealing is provided.

FIG. 6 is an image of the annealed nickel film coated with a graphene layer.

FIGS. 7-10 illustrate the transfer of a few-layer graphene film from the nickel-coated substrate to a target substrate.

In the accompanying drawings, like reference characters refer to the same or similar parts throughout the different views. The drawings are not necessarily to scale, emphasis instead being placed upon illustrating particular principles, discussed below.

DETAILED DESCRIPTION

Figure 1:
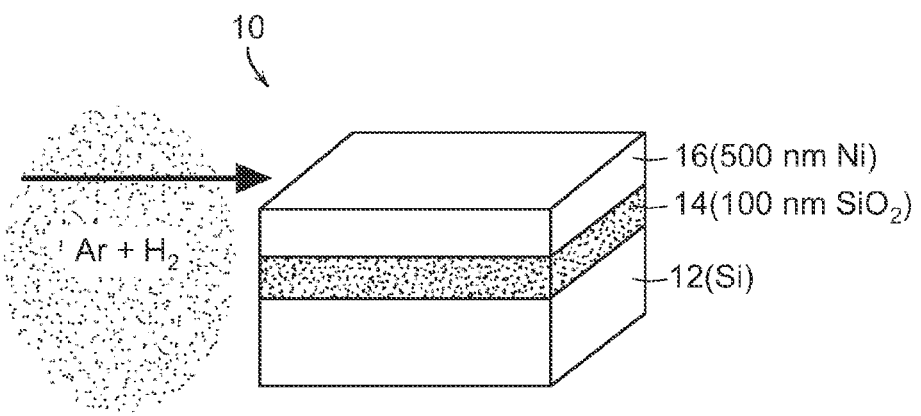
FIG. 1 illustrates the evaporation and deposition of a nickel film on a thermally grown oxide layer on a silicon (Si) substrate.

The foregoing and other features and advantages of various aspects of the invention will be apparent from the following, more-particular description of various concepts and specific embodiments within the broader bounds of the invention. Various aspects of the subject matter introduced above and discussed in greater detail below may be implemented in any of numerous ways, as the subject matter is not limited to any particular manner of implementation. Examples of specific implementations and applications are provided primarily for illustrative purposes.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. For example, when a particular composition is referenced, practical real-world standards apply; e.g., the potential presence of at least trace impurities (e.g., at less than 0.1% by weight or volume) can be understood as being within the scope of the description.

Spatially relative terms, such as "above," "upper," "beneath," "below," "lower," and the like, may be used herein for ease of description to describe the relationship of one element to another element, as illustrated in the figures. It will be understood that the spatially relative terms are intended to encompass different orientations of the apparatus in use or operation in addition to the orientation depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. Additionally, the terms, "includes," "including," "comprises" and "comprising," specify the presence of the stated elements or steps but do not preclude the presence or addition of one or more other elements or steps.

Described, as follows, is a technique for generating single-layer-graphene or few-layer-graphene films on arbitrary target substrates by using chemical vapor deposition (CVD) for the synthesis of graphene films from nickel substrates followed by transfer of the film. Current methods for obtaining graphene on silicon dioxide (also referred to as silica or SiO$_2$) or other semiconductor substrates include mechanical cleavage of highly oriented pyrolytic graphite, ultra-high vacuum (UHV) annealing of single-crystal silicon carbide (SiC) (0001) or depositing graphite oxide (GO) sheets from a liquid suspension, followed by chemical reduction. These methods, however, either have a significant limitation to the substrate type [for example, a silicon (Si) substrate with a 300 nm thermally grown oxide is used for mechanical cleavage in order to identify the location of the graphene, or single-crystal SiC wafers are used for the high-temperature vacuum annealing method]; and these methods produce only graphene flakes with random shape, size, thickness and location on the substrate. For large-scale electronic applications, it is desired to obtain large-area, high-quality graphene pieces, ideally on any substrate.

As shown in FIG. 1, an example of this fabrication procedure commences with the evaporation and deposition of a sub-1 μm (e.g., a 100-500 nm) metal film 16 on a silicon (Si) substrate 12 with a thermally grown oxide (SiO$_2$) layer 14, which will serve as the growth substrate for the graphene film. In an alternative embodiment, a quartz (SiO$_2$) substrate is used in place of the Si/SiO$_2$ substrate as the insulating substrate. The metal film can be formed of any transition metal that either catalyzes the dehydrogenation of hydrocarbons or has certain carbon solubility under elevated temperature, such as nickel, platinum, ruthenium and copper; in this embodiment, the metal is nickel (Ni). Nickel has been widely used for the synthesis of carbon nanotubes. Furthermore, nickel has a face-centered cubic structure and its (111) face forms a triangular network of nickel atoms with lattice parameters similar to those of graphene. A protective oxide layer (e.g., nickel oxide) can be formed on the surface of the metal film, and the oxide layer can be removed before graphene formation by contacting it with hydrofluoric acid (HF), potassium hydroxide (KOH), or sodium hydroxide (NaOH).

In some embodiments, an intermediate layer can be formed between the nickel layer and the $Si/SiO_2$ substrate. For example, a 5 nm chromium layer can be deposited via evaporation or sputtering on the $Si/SiO_2$ substrate before deposition of the nickel layer; the chromium wets the silica better and can prevent the subsequently deposited nickel layer from breaking up on the substrate surface. The metal film can be deposited either by electron-beam or thermal evaporation, sputtering, or simply electrochemical deposition. In another alternative embodiment, the entire substrate can be formed of a metal, such as nickel, without the underlying insulating substrate; in this embodiment, however, etching to free the graphene film may not be as readily limited to a thin surface layer (e.g., a thin nickel layer) beneath the graphene film, resulting in a need for more acid and a longer etching process.

Figure 2:
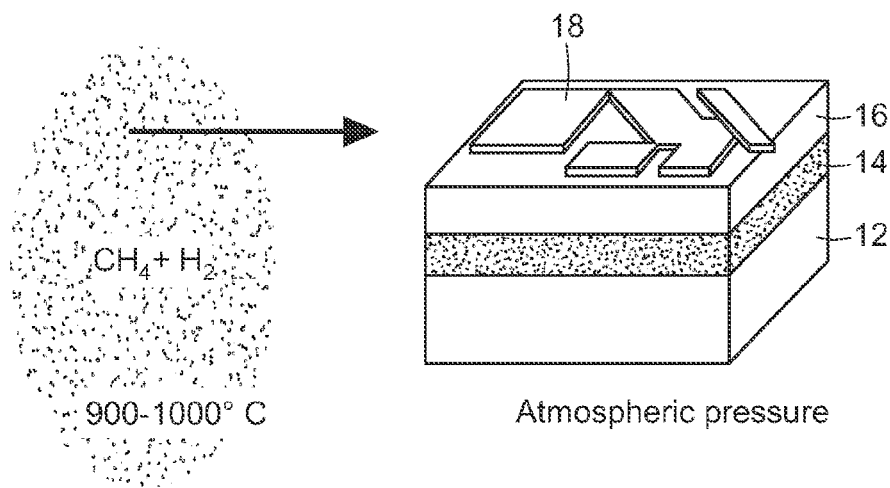
FIG. 2 illustrates the subsequent production of a graphene film as the carbon-doped nickel film is cooled down.
Figure 3:
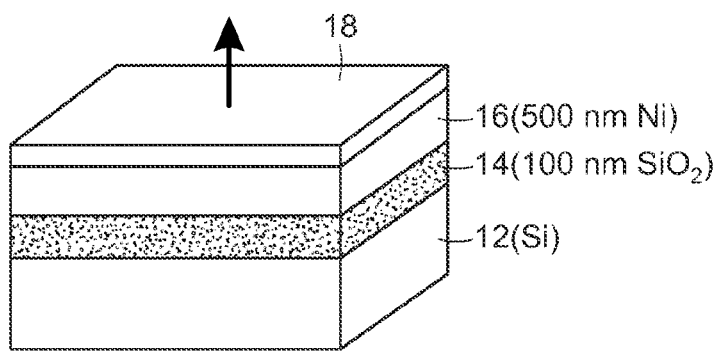
FIG. 3 illustrates a full graphene coating on the nickel film.

Next, the nickel-coated substrate 10, with the nickel-coated surfaces each covering an area 1-2 $cm^2$ or larger in size, is loaded into a chemical-vapor-deposition chamber and heated to 900° C.-1000° C. under the flow of 600 standard cubic centimeters per minute (sccm) argon (Ar) and 400 sccm hydrogen ($H_2$). The doping of the nickel with carbon by chemical-vapor-deposition growth is carried out at 900° C. or 1000° C. with a 1-20 sccm flow of methane ($CH_4$) and a 1400 sccm flow of $H_2$ for several minutes (usually 5 minutes). The carbon-doped nickel film is cooled down and produces a graphene film 18 on the substrate 10, as shown in FIG. 2. Other carbon sources, such as any carbon-containing gas—e.g., ethylene, alcohol and/or carbon monoxide, or solid carbon vapor can be used for this implementation. Alternatively, any metal-carbon solid solution can be used as starting material to precipitate graphene on the metal surface. It is understood that temperatures below 900° C. can also be used provided that a suitable amount of hydrocarbon to dope the metal film (or surface) is used. After this process, as shown in FIG. 3, the metal layer 16 is fully coated with a graphene film 18.

An image of a deposited nickel film is provided in FIG. 4, while an image of that nickel film after annealing is provided in FIG. 5. Finally, an image of the annealed nickel film subsequently coated with a graphene layer is provided in FIG. 6.

Next, the graphene film 18 is coated with a protective support layer 20, as shown in FIG. 7; the protective support layer 20 can be formed, e.g., of a polymer, such as polymethylmethacrylate (PMMA) or polydimethylsiloxane (PDMS). In this embodiment, the polymer is polymethylmethacrylate. The polymethylmethacrylate layer 20 is spin-coated on the graphene film by pouring, e.g., 50-100 micro-liters of polymethylmethacrylate on the graphene-coated substrate and then spinning the substrate at 3000 rpm. The final thickness of the PMMA coating 20 can be set to, e.g., between 200 nm to 1.5 microns by controlling the number of iterations of the spin coating process, described above, the spinning speed or the concentration of the PMMA solution. A thicker coating of the polymethylmethacrylate layer 20 can lead to better manipulation of the graphene/polymethylmethacrylate after being released.

The underlying nickel in the layered structure is then etched with a mild aqueous hydrochloric acid (HCl) solution 22, as shown in FIG. 8. The concentration of the HCl is, e.g., around 3 volume-% in water. The structure can be immersed in the HCl solution 22 for around one hour to release the supported film layer 24 (i.e., the synthesized graphene film layer 18 and the adhered polymethylmethacrylate 20). Other acidic solutions or any chemical known to etch Ni may be used for this purpose in place of the HCl solution.

Figure 10:
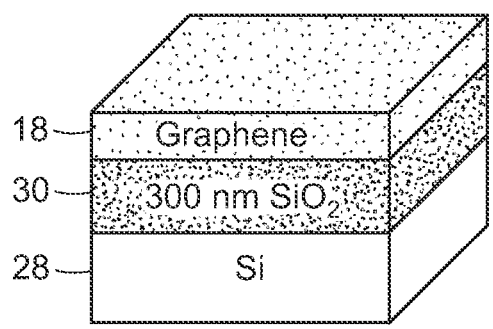

Subsequently, the supported film layer 24 can be transferred to any substrate for analysis and characterization. In one embodiment, once the supported film layer 24 is released, the supported film layer 24 is moved to a beaker with water, where the supported film layer 24 will be floating at the water/air interface with the graphene side 18 facing down. Next, the (arbitrary) target substrate 26 [in this case, a silicon substrate 28 coated with a silica ($SiO_2$) layer 30] is immersed in the water and is moved upwards from the configuration shown in FIG. 9 so that the target substrate 26 "picks up" the supported film layer 24 on the water surface, thereby producing a target-substrate/graphene/polymethylmethacrylate arrangement. When this layered structure dries, the supported film layer 24 bonds to the arbitrary target substrate 26. The arbitrary target substrate 26 to which the supported film layer 24 is transferred can have a continuous or discontinuous structure (e.g., the substrate 26 can be in the form of a frame with internal voids/gaps). The polymethylmethacrylate 20 is then removed by slowly flowing a solvent (e.g., a ketone, such as acetone) over it. The synthesized graphene film 18 in the final structure 32, shown in FIG. 10, can include traces of polymethylmethacrylate on the graphene surface from its earlier adhesion to the polymethylmethacrylate layer 20. Since the polymethylmethacrylate layer is used only as support, any other polymer or material can be used for this purpose as long as it is possible to remove the support when it is transferred to the target substrate.

After the transfer, the graphene film 18 can be patterned via a lithography process, such as photolithography, electron-beam lithography and interference lithography. In other embodiments, the metal film can be patterned by lithography before formation of the graphene film thereon. In additional embodiments, part of the metal surface can be protected with a covering to prevent graphene growth thereon so that a graphene pattern can be directly obtained.

In some embodiments, after the graphene is transferred to the arbitrary target substrate 26 and/or after a particular pattern of graphene is generated, particular areas of the graphene are doped by one or more chemicals, such as potassium and/or polyethyleneimine, to generate p- or n-type regions for devices. In additional embodiments, a certain area of the graphene is intercalated with different molecules.

Figure 11:
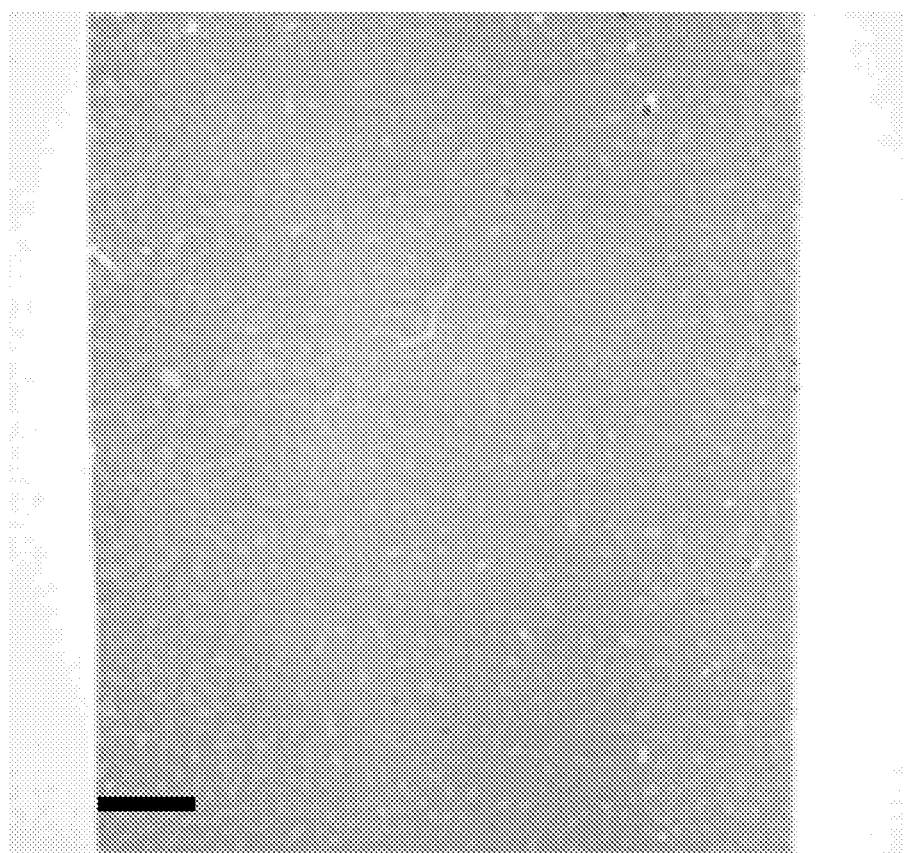
FIGS. 11-16 are optical images and atomic-force-microscopy characterizations of the few-layer graphene film on a Si/SiO$_2$ substrate.
Figure 12:
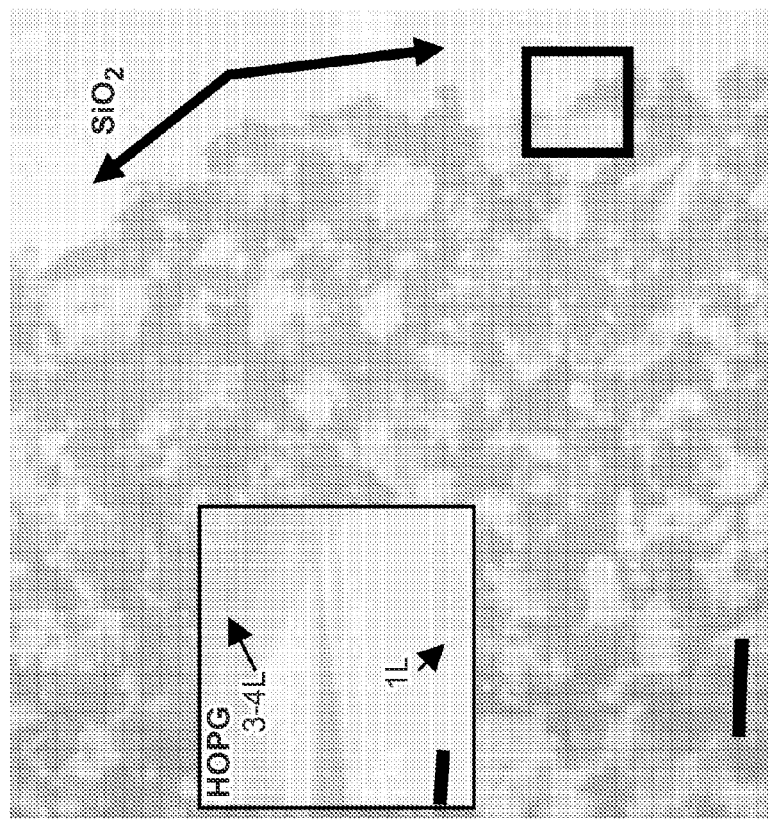
Figure 14:
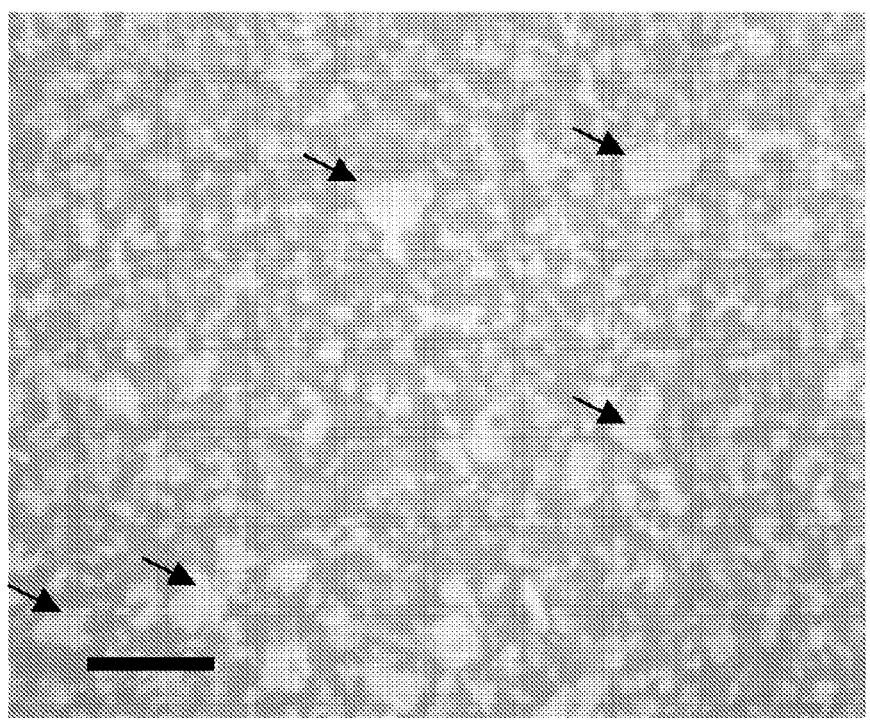

An optical image of a few-layer (i.e., 2-10 layer) graphene film grown on a $Si/SiO_2$ substrate with a 300 nm oxide layer is provided in FIG. 11 (where the scale bar represents 500 µm), showing that the synthesized graphene film is continuous over the whole area defined by the nickel film. The rectangular shape of the film is fixed by the rectangular shape of the nickel-coated substrate on which the film was grown. The thickness of the film varies from one location to another, giving rise to a non-uniform color contrast under the optical microscope; the color contrasts are visible here as differences in darkness (FIGS. 12 and 14). FIG. 12 (where the scale bar represents 10 µm) is a magnified view (100×) of an edge of the synthesized few-layer graphene film on the $Si/SiO_2$ substrate, and the color (darkness) contrast enables the identification of regions of different thicknesses. The color (darkness) contrast is due to the light interference effect on the $SiO_2$, which is modulated by the graphene layer. Although the contrast is sharp, the difference in the numbers of layers corresponds to only one or a few graphene layers. As a comparison, the optical image of mechanically cleaved highly oriented pyrolytic graphite is shown in the inset (where the scale bar represents 20 µm) of FIG. 12. The respective shadings for one layer of graphene (1 L) and for 3-4 layers of graphene (3-4 L) can also be seen in the inset of FIG. 12.

Figure 13:
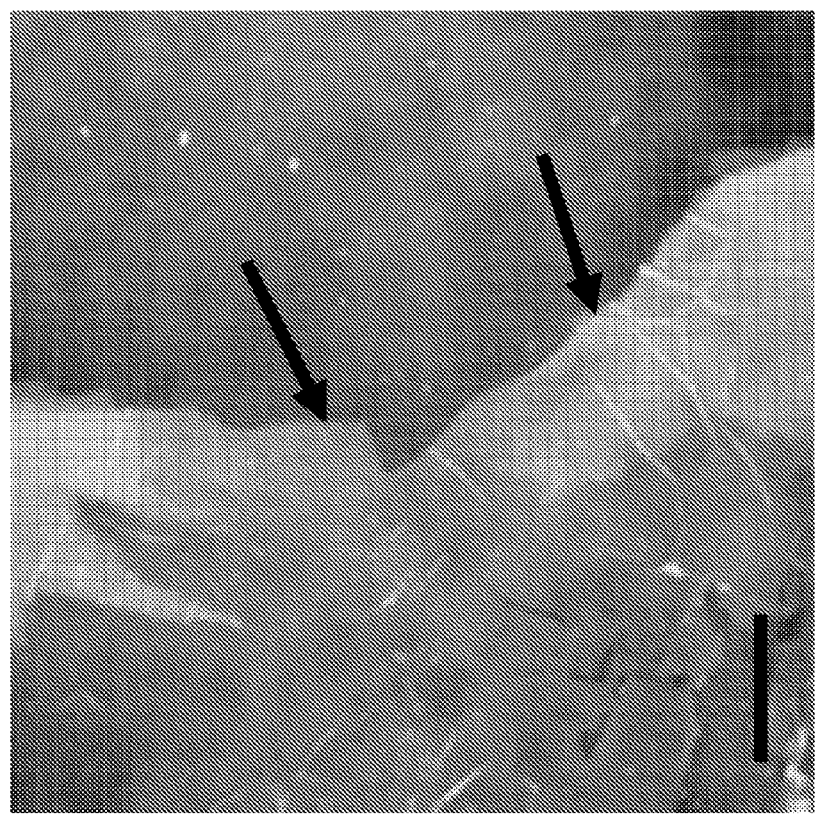
Figure 15:
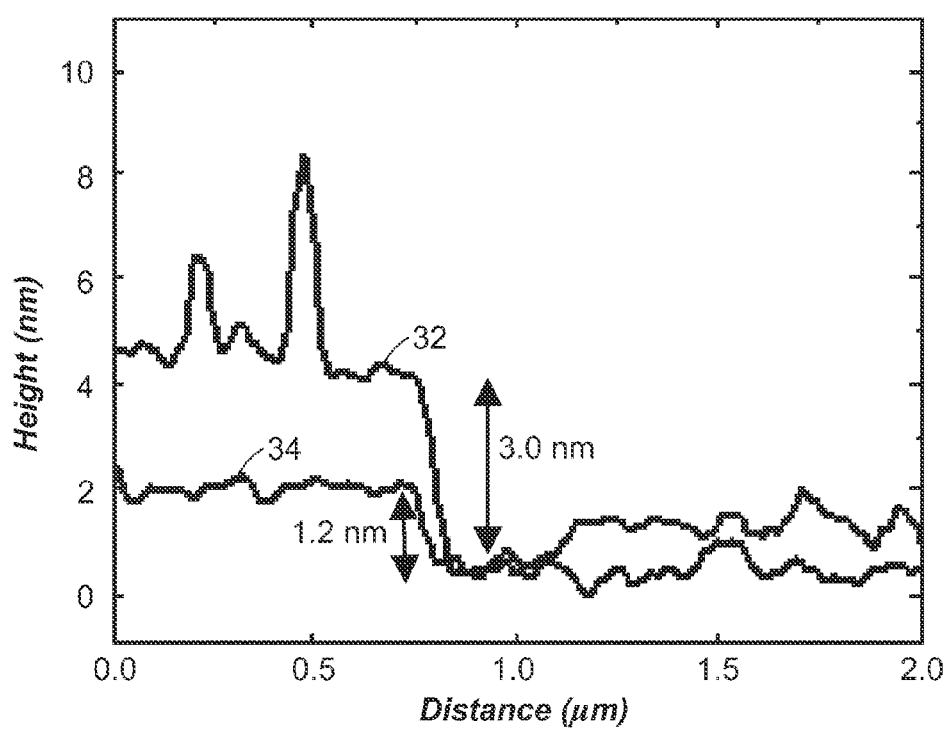
Figure 16:
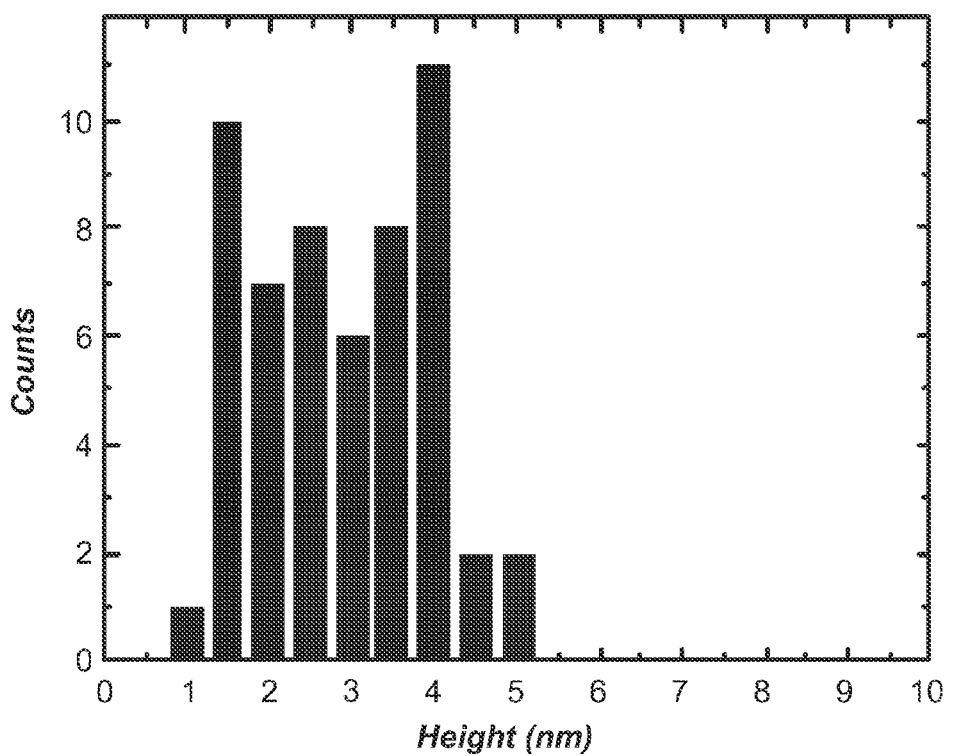
Figure 17:
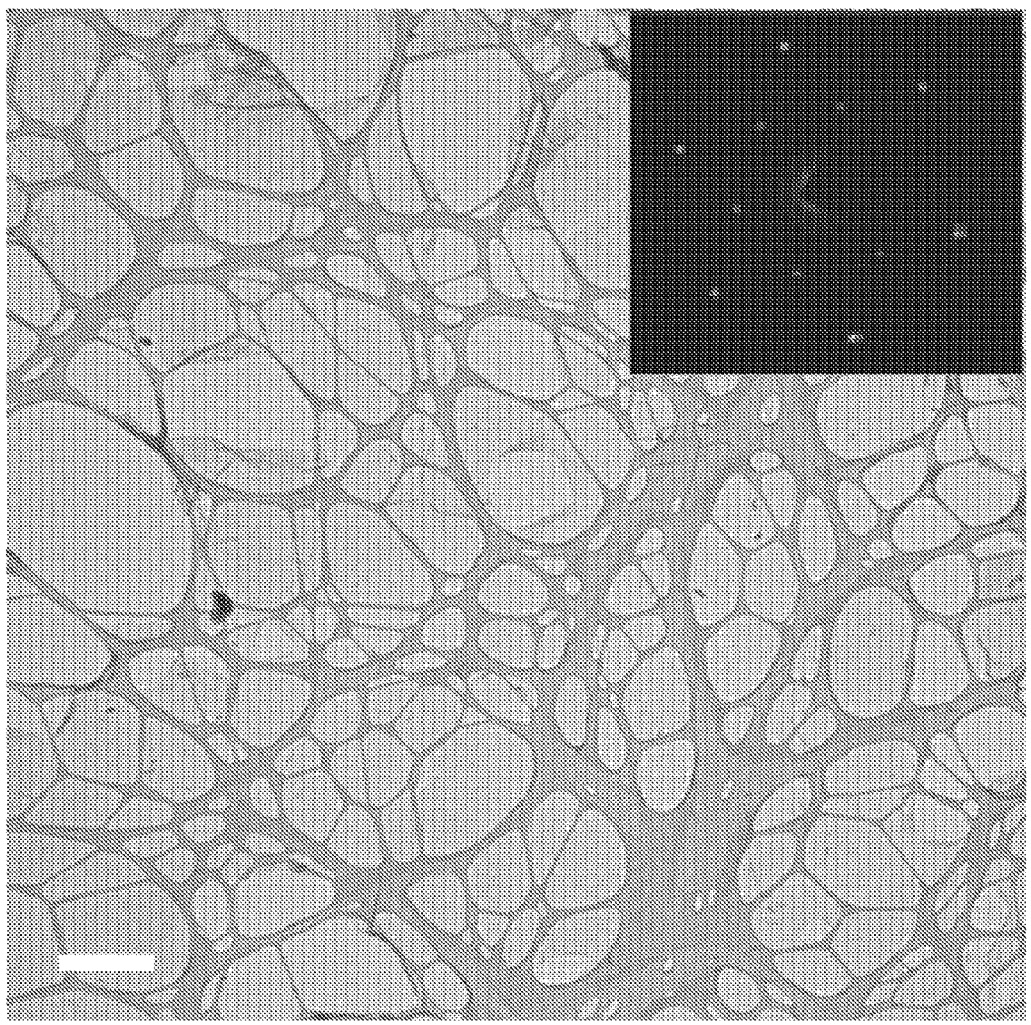
FIGS. 17-22 are high-resolution transmission-electron-microscope images illustrating the synthesized graphene films with various numbers of layers.

To further confirm the correlation of the colors (levels of darkness) in the optical images to the height of the films, measurements were made by atomic force microscopy (AFM). FIG. 13 (where the scale bar represents 1 μm) is the atomic-force-microscopy image of the region enclosed by the black square toward the lower right of FIG. 12. The lighter sections in this region correspond to a film thickness of roughly 1 nm, as revealed by the corresponding height measurements (FIG. 15) from the atomic-force-microscopy image (FIG. 13). In FIG. 15, the top curve 32 corresponds with a region of high color contrast (a darker region) taken at the lower arrow in FIG. 13, while the lower curve 34 corresponds with a region of low color contrast (a lighter region) taken at the upper arrow in FIG. 13. This thickness is typically assigned to a monolayer or bilayer of graphene on $SiO_2$. The dark region corresponds to a 3.0 nm step, as shown by the corresponding height-distribution measurements (FIG. 15) of the same atomic-force-microscopy image (FIG. 13). Furthermore, a thickness distribution (FIG. 16), obtained through atomic-force-microscopy images from the film edge marked by the arrows in FIG. 12 (where the scale bar represents 10 μm), suggests that the film thickness varies from 1-5 nm with an average thickness of 2.8 nm. The range of thicknesses corresponds to 1-12 graphene layers, taking a 1 nm height for the first layer and 0.35 nm for each subsequent layer. This height average corresponds to an average of 6-7 graphene layers.

A high-resolution transmission electron microscope was also used to characterize the structure of the synthesized few-layer-graphene films (FIGS. 17-22). The chemical-vapor-deposition grown films were transferred by the same method to lacey carbon grids, shown by the low-magnification transmission-electron-microscopy image in FIG. 17. Although the film at some places becomes broken across large holes (greater than 2 $\mu m^2$ in area) during the transfer process, the overall continuity of the film suggests that these films exhibit excellent mechanical stability, even though the thinnest part is only one monolayer thick. Electron diffraction (inset in FIG. 17) on the graphene film reveals a hexagonal pattern confirming the three-fold symmetry of the arrangement of carbon atoms and the high-quality crystalline structure of the regions analyzed (the electron beam size used is 50 nm). In different regions of the film, different diffraction patterns can sometimes be seen, but only individual diffraction spots are observed, indicating that all of the examined regions are single crystalline.

Figure 18:
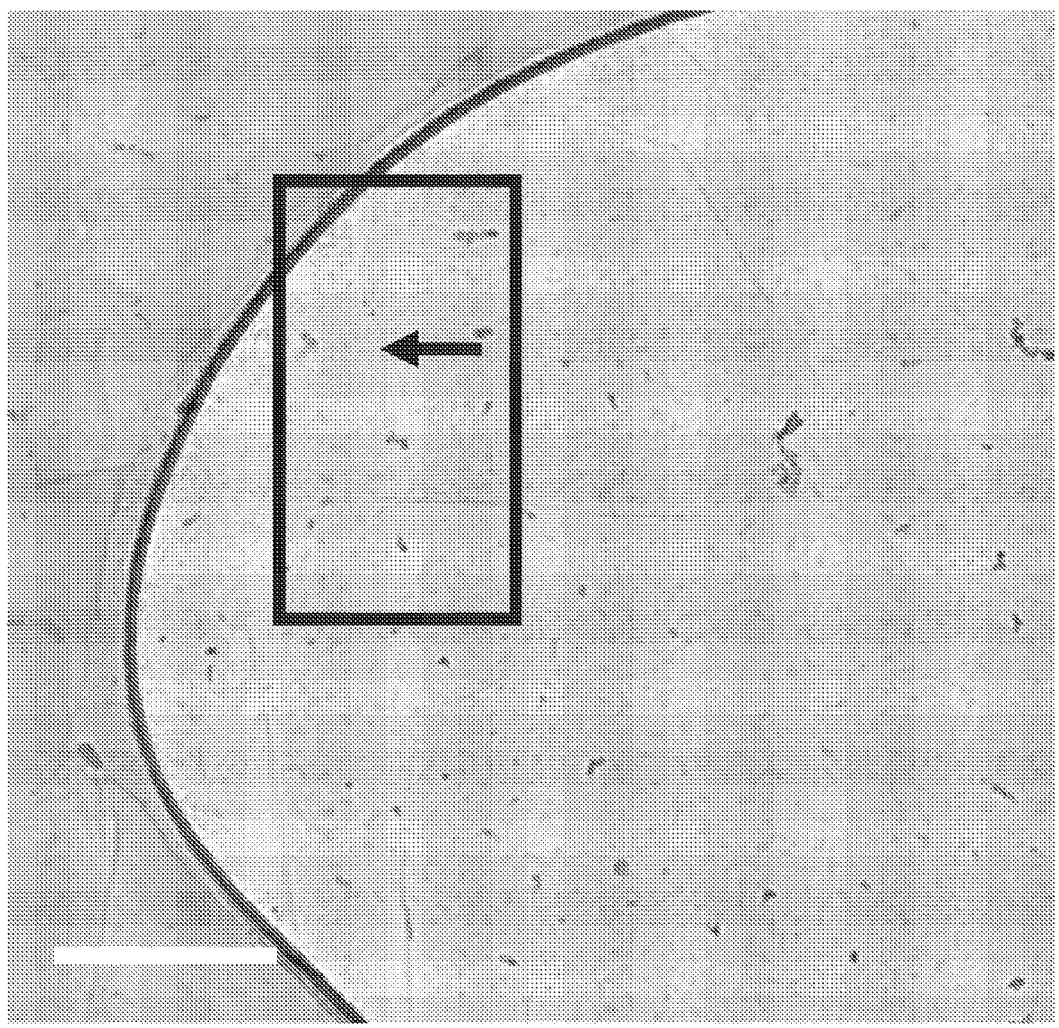
Figure 21:
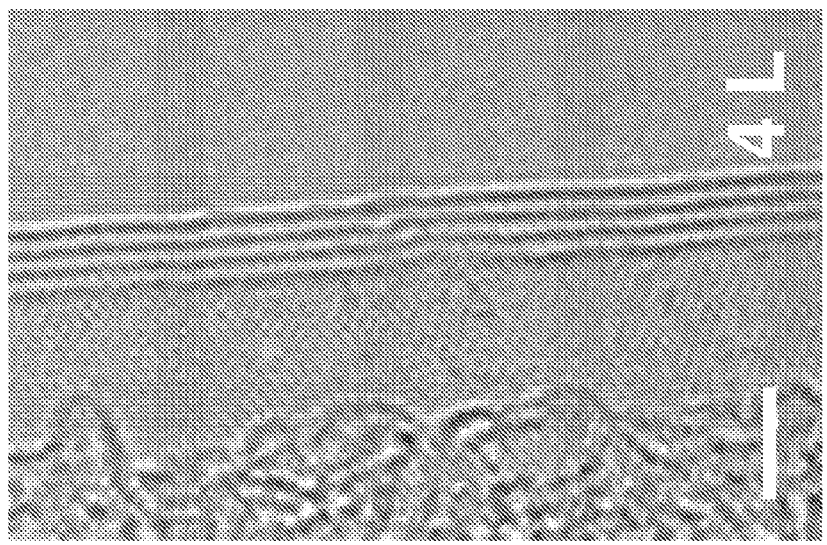
Figure 20:
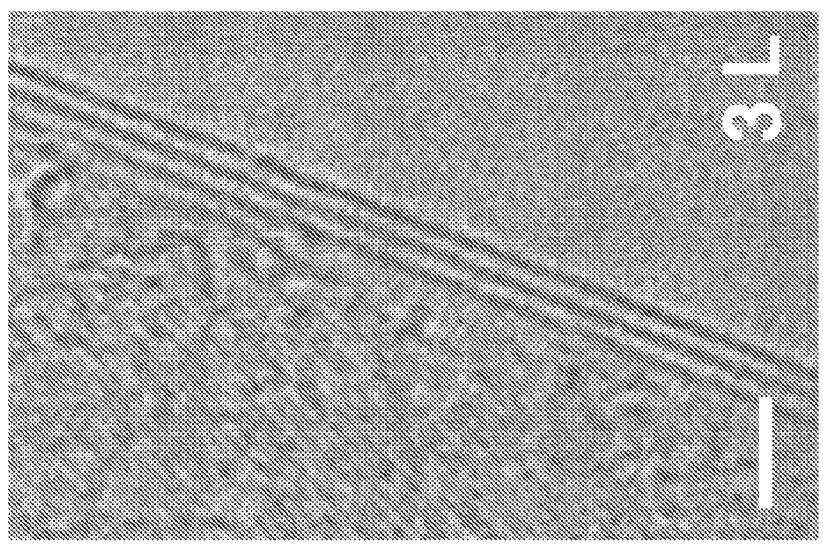
Figure 19:
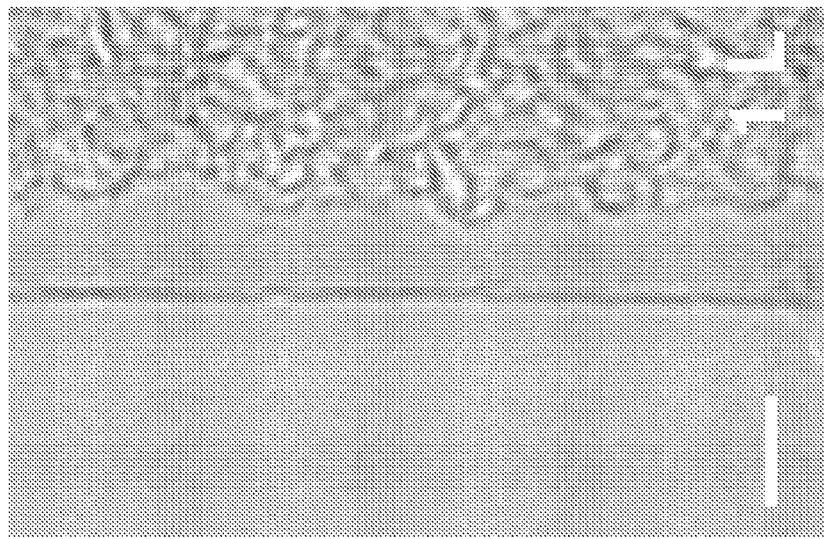
Figure 22:
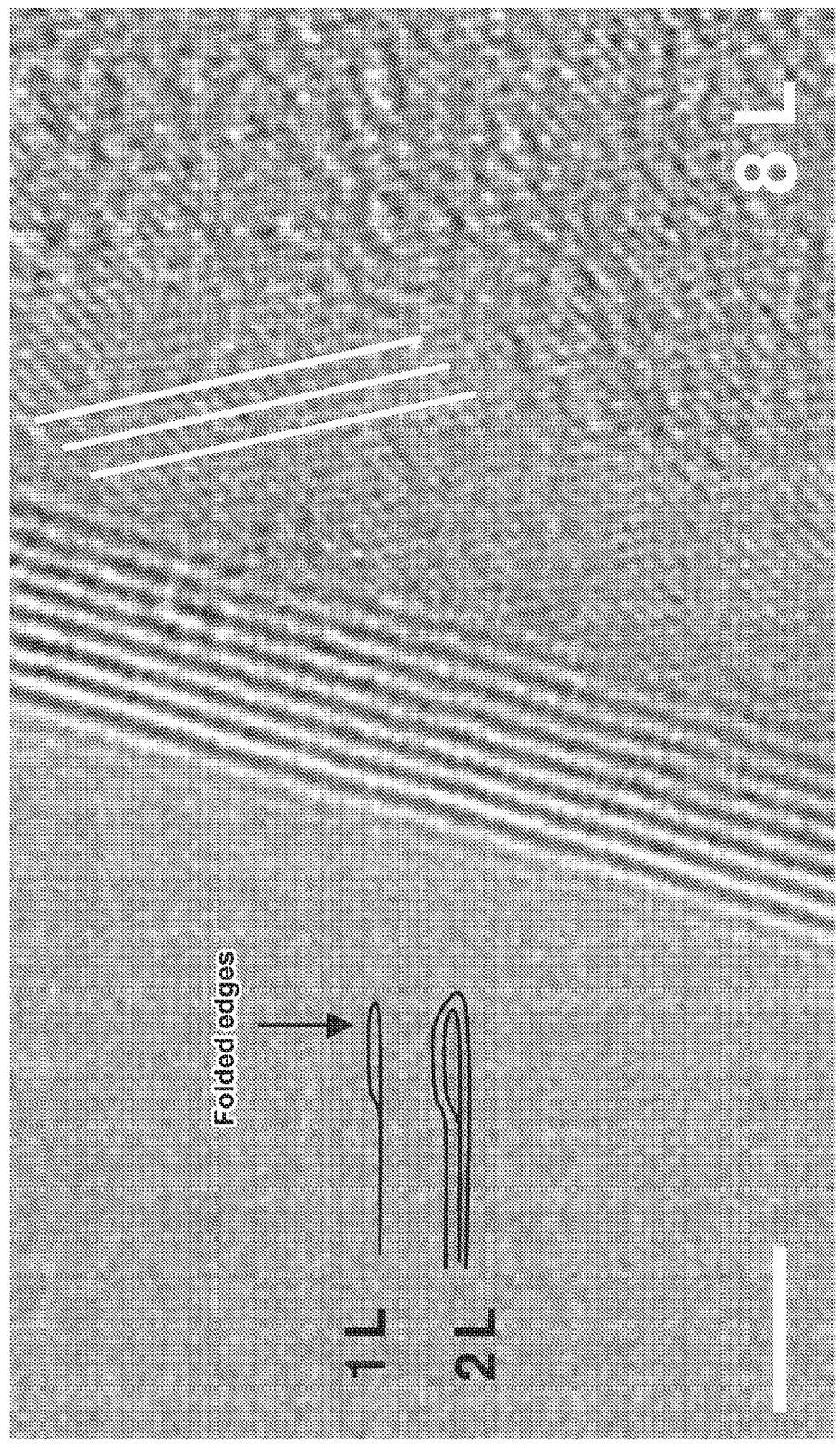

FIG. 18 is an intermediate magnification image showing two regions of the film with different thicknesses. The black arrow points to the edge between the thinner part and the thicker part. Although graphene regions with different layer thicknesses display a sharp color contrast under the optical microscope, the thickness differences are difficult to distinguish under the transmission electron microscope since the difference is only a few atomic layers (sometimes only one atomic layer). Imaging along the edge of the film shows that the edge always folds back, which results in the appearance of parallel lines in the transmission-electron-microscopy image along the film edges. These edges provide a good way to determine the number of layers of the graphene film (see FIGS. 19-22, where the scale bars represent 2 nm). FIG. 19 shows the edge of the film that is only one layer in thickness. FIG. 20 shows the edge of the film that is three layers of thickness. FIG. 21 shows the edge of the film that is four layers of thickness. Finally, FIG. 22 shows the edge of the film that is eight layers of thickness.

Similar folding has been reported previously for the transmission-electron-microscopy characterization of mechanically cleaved graphene. Typically, sections of 1-8 layers are observed in the synthesized samples. The interlayer spacing measured from the images is around 0.34±0.007 nm. In regions comprising a few graphene layers, it is possible to observe lattice fringes forming a triangular lattice, suggesting an ordering in the layer stacking (FIGS. 20-22). The lattice constant, which is usually around 0.23±0.01 nm (0.246 nm for graphite), can be estimated from such images. These high-resolution transmission-electron-microscopy images reveal the single-crystalline nature of the examined areas, indicating the high quality of the synthesized graphene films, which is comparable to the quality of the mechanically cleaved highly oriented pyrolytic graphite.

Figure 23:
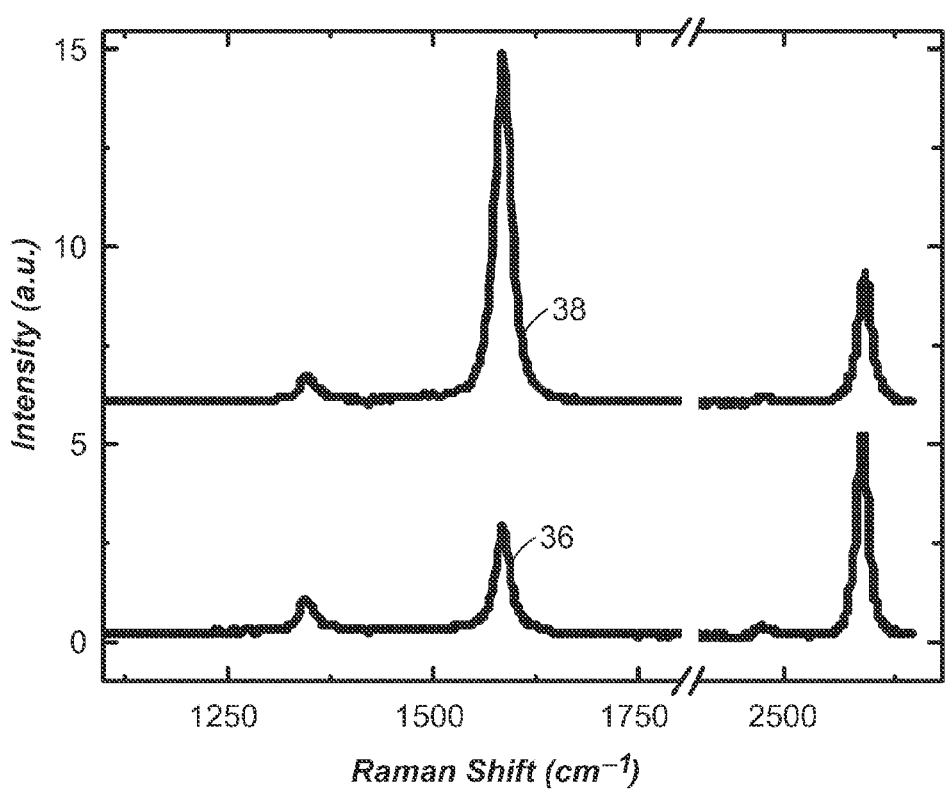
FIGS. 23 and 24 are Raman spectra characterizations of the few-layer graphene film on a Si/SiO$_2$ substrate.
Figure 24:
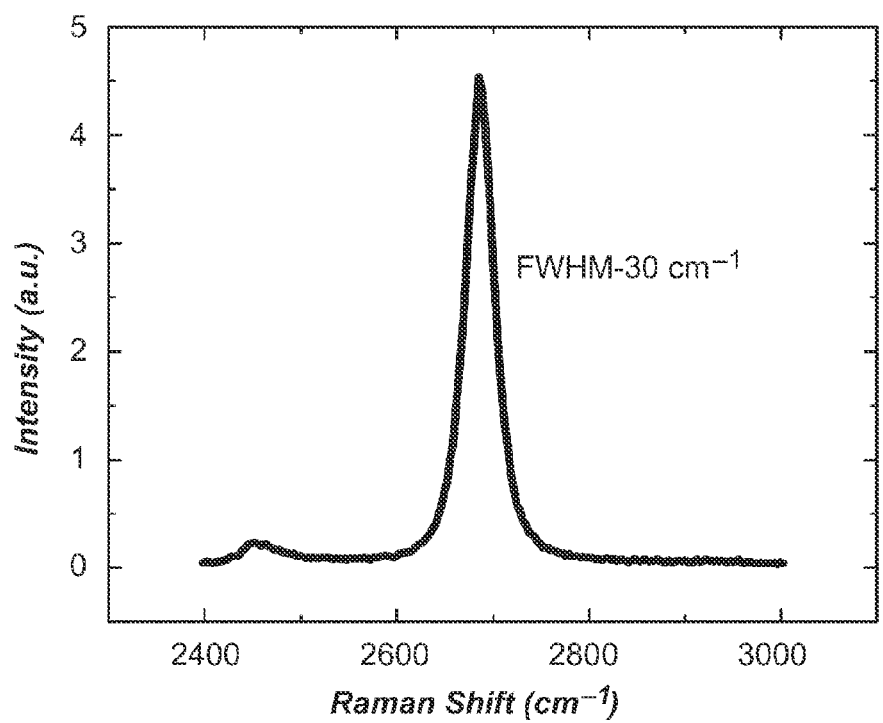

Raman spectroscopy was also used to characterize the synthesized few-layer-graphene films. FIG. 23 shows typical Raman spectra of regions consisting of one to two graphene layers (bottom curve 36) and 3-10 graphene layers (top curve 38), which correspond to the lighter regions and darker regions, respectively, in the optical images. The laser excitation wavelength was 532 nm (2.33 eV). The relatively low intensity of the disorder-induced D band (~1350 $cm^{-1}$) confirms the high quality of the graphene structure. As a comparison, under the same laser excitation energy, the samples give a much weaker D band feature than the epitaxial graphene derived from high-temperature annealing of single-crystal SiC. The sharp G' band (linewidth close to 30 $cm^{-1}$) (FIG. 24), with a higher intensity than the G band, is the hallmark of monolayer graphene; and it is also observed here (FIG. 23, 1-2 layer curve 36). For bi-layer graphene derived from mechanically cleaved highly oriented pyrolytic graphite, the G' band is composed of four peaks due to the interlayer coupling. As a result, the peak intensity decreases and the peak width increases in bi-layer graphene 36. As the number of layers increases, these trends in the G' peak intensity and width continue. In contrast, for the synthesized few-layer graphene samples, this trend is absent-on most regions, the line shapes of the G' band for 2-layer or 3-layer CVD graphene are similar to that of CVD single-layer graphene. This is because the layer stackings do not occur in an AB ordering manner as in graphite. This gives rise to weaker interlayer couplings and therefore the Raman G' band of 2- or 3-layer CVD graphene will look the same as that of the single layer CVD graphene.

The electrical measurement of the synthesized few-layer graphene films on $Si/SiO_2$ substrates gave a resistivity of 770 to 1000 Ω/sq measured by a four-point probe method. The average thickness of the film is 3 nm, which corresponds to a bulk resistivity of $2.31 \times 10^{-4}$ Ωcm. In comparison to high-quality highly oriented pyrolytic graphite, which has single-crystalline domain sizes of hundreds of μm (lateral dimension), the synthesized films are only about ten times higher in resistivity.

The resulting graphene film can be used in a variety of applications. For example, the graphene film can be used as a transparent electrode, as an ultrathin conducting electrode, as an electrode for a battery, as a transistor device (both for low and high frequency), as a sensor to detect a chemical or biological agent, as an optical detector, as an interconnect for an integrated circuit, as an on-chip capacitor for an integrated circuit, as an on-chip inductor for an integrated circuit, as a hetero-junction device (metal-semiconductor) including graphene nanoribbons with different crystal orientations, as an in-plane thermal conductor to spread heat dissipation, as a quantum device or spintronic device, as a graphene-nanotube heterostructure (together with nanotubes), as a p-n junction diode or bi-polar junction transistor, as a device with an adjustable bandgap, and as an interface for different materials (e.g., for interfacing with Si, GaN and/or GaAs).

Figure 25:
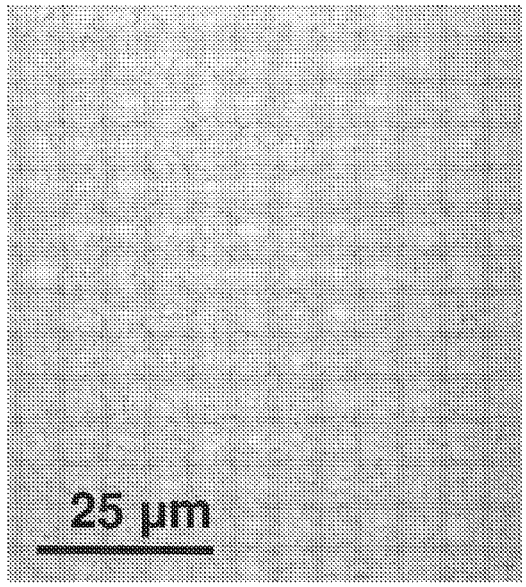
FIGS. 25 and 26 show optical images of bare Ni films with different Ni grain sizes.
Figure 26:
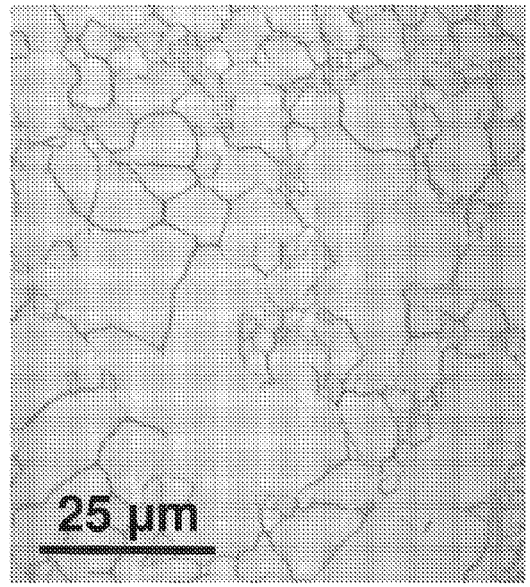
Figure 27:
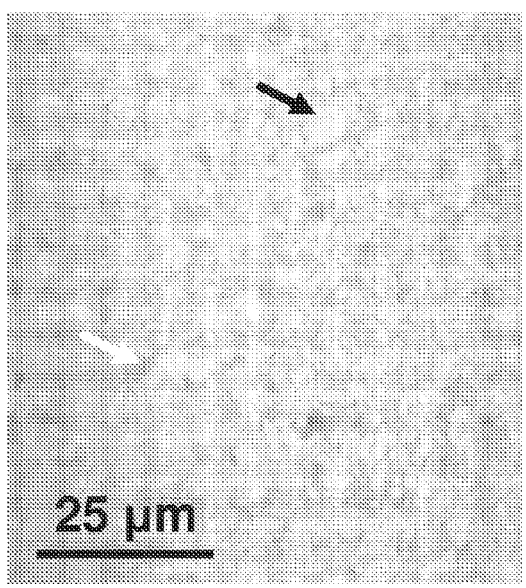
FIGS. 27 and 28 show optical images of the same Ni films after a graphene film was grown on their surfaces.
Figure 28:
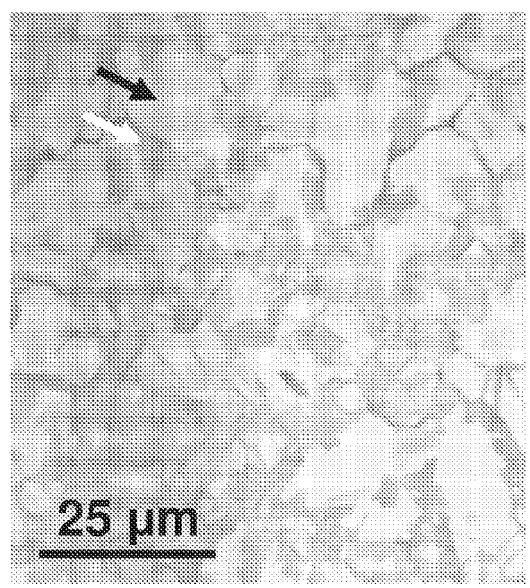
Figure 29:
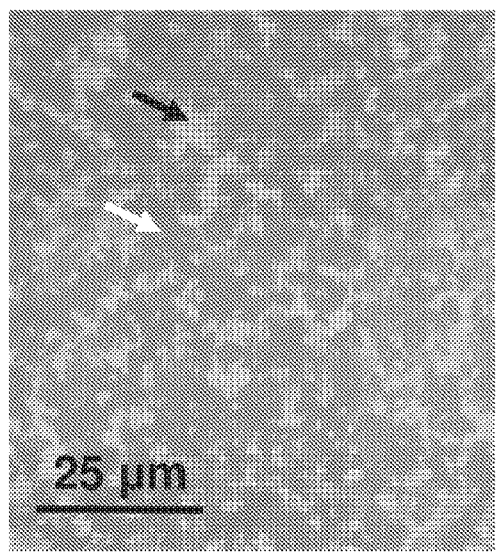
FIGS. 29 and 30 show the graphene films grown on the Ni films above after being transferred to SiO$_2$/Si substrates.
Figure 30:
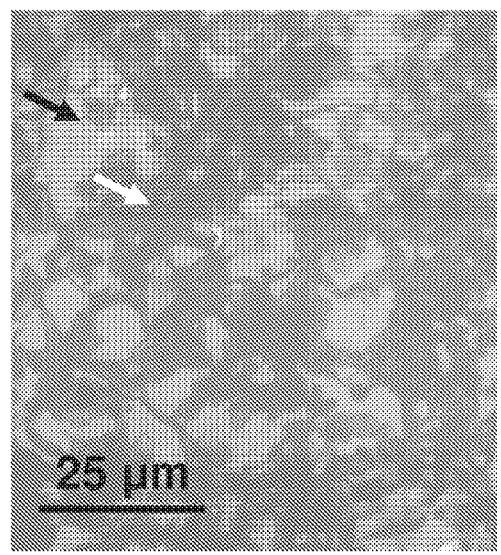

Different methods can be used to improve the thickness uniformity of the graphene films obtained by the method described above. It was found that the sizes of monolayer or bilayer graphene pieces depend either on the size of the grains of the Ni film or the rate at which the graphene film precipitates on the Ni surface. A correlation between the size of the nickel grains and the size of the graphene areas with one or two graphene layers is observed. FIG. 25 and FIG. 26 show optical images of bare Ni films with different Ni grain sizes. FIG. 27 and FIG. 28 show optical images of the same Ni films after a graphene film was grown on their surfaces. FIG. 29 and FIG. 30 show the graphene films grown on the Ni films above but transferred to $SiO_2/Si$. The darker areas near the grain boundaries (white arrows) correspond to graphite. The growth of one or two layers of graphene occurs only on the center surface of the Ni grains away from the grain boundaries (black arrows). Therefore, the area covered by 1-2 layer graphene is limited by the size of the nickel grains under these process conditions. In order to enlarge these 1-2 layer regions, the size of the nickel grains is increased. Different procedures are used to enhance the grain sizes of the thin nickel film in order to enlarge the area of single- and bi-layer graphene regions. It was found that high deposition temperatures and high argon pressures during sputtering deposition of the Ni film on $SiO_2/Si$ promotes the growth of nickel grains with (111) orientations and increases the final Ni grain sizes. The use of a rough $SiO_2/Si$ surface also results in large Ni grain sizes. The annealing procedure can also be engineered to optimize the size of the Ni grains. Such annealing procedures use high temperatures (~900-1100° C.) and short annealing times (~5-10 minutes).

Figure 31:
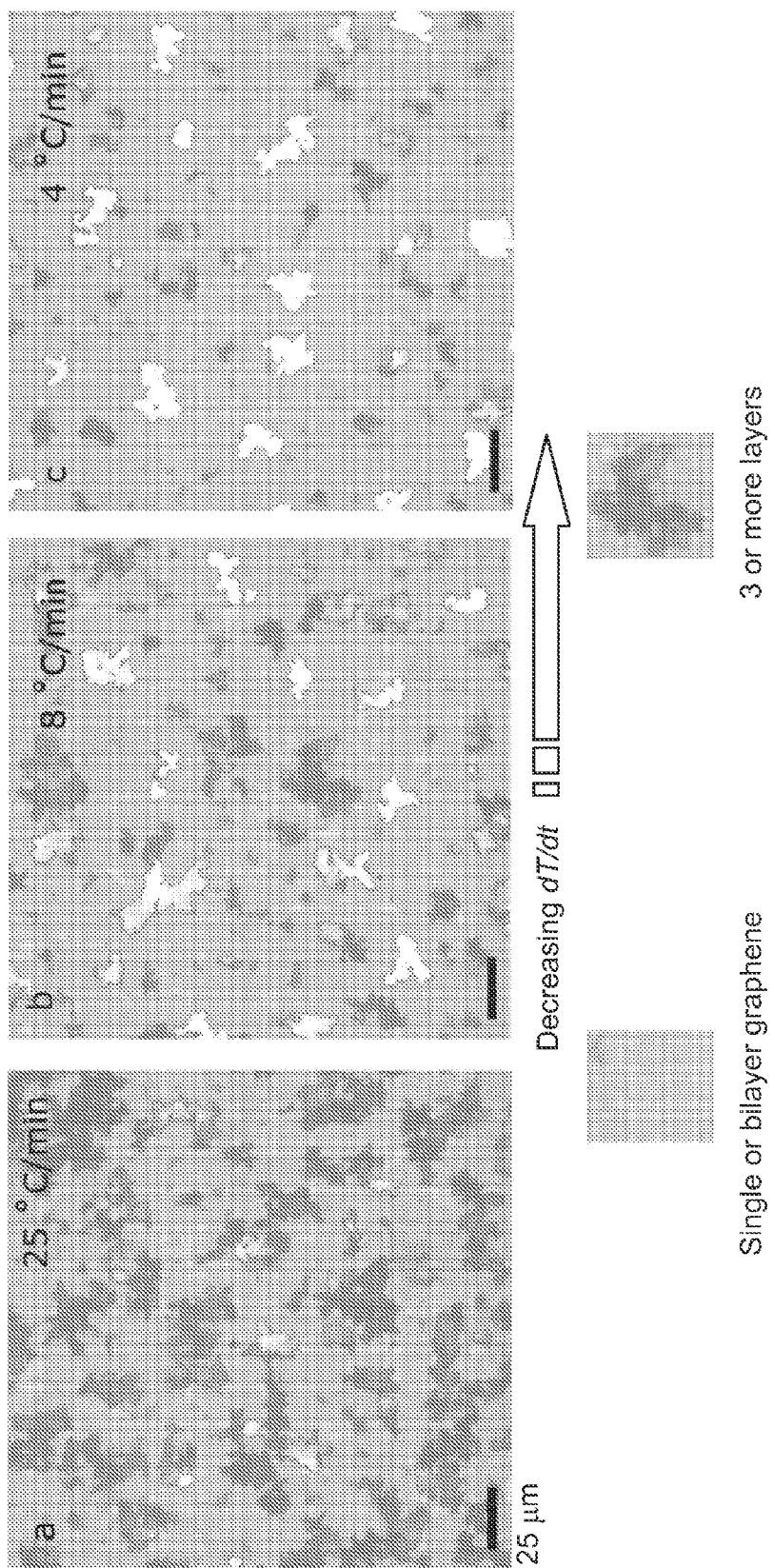
FIG. 31 shows optical images of graphene films after being transferred to SiO$_2$/Si substrates.

The thickness uniformity of the film can also be improved by controlling the rate of cooling of the Ni film during the CVD process. By controlling the rate of cooling, the rate of carbon segregation on the surface of Ni can be controlled. By decreasing the cooling rate, the coverage of single- and bi-layer regions of the graphene film increases. This way, it is possible to generate a graphene film with up to 87% coverage of a mixture of single- and bi-layer graphene. FIG. 31 shows optical images of such films after being transferred to $SiO_2/Si$ substrates. The light gray background consists of no more than two graphene layers. Under these growth conditions, nucleation of multilayer graphene does not occur at every grain boundary of the Ni film but at random locations of the film, as shown in FIG. 31. Therefore, the thickness variations of the graphene film are independent of the grain size of the Ni film used. In this case, the optimization of the Ni grain sizes becomes unnecessary.

In describing embodiments of the invention, specific terminology is used for the sake of clarity. For purposes of description, each specific term is intended to at least include all technical and functional equivalents that operate in a similar manner to accomplish a similar result. Additionally, in some instances where a particular embodiment of the invention includes a plurality of system elements or method steps, those elements or steps may be replaced with a single element or step; likewise, a single element or step may be replaced with a plurality of elements or steps that serve the same purpose. Further, where parameters for various properties are specified herein for embodiments of the invention, those parameters can be adjusted up or down by $1/100^{th}$, $1/50^{th}$, $1/20^{th}$, $1/10^{th}$, $1/5^{th}$, $1/3^{rd}$, $1/2$, $3/4^{th}$, etc., or by rounded-off approximations thereof, unless otherwise specified. Moreover, while this invention has been shown and described with references to particular embodiments thereof, those skilled in the art will understand that various substitutions and alterations in form and details may be made therein without departing from the scope of the invention; further still, other aspects, functions and advantages are also within the scope of the invention. The contents of all references, including patents and patent applications, cited throughout this application are hereby incorporated by reference in their entirety. Appropriate components and methods of those references may be selected for the invention and embodiments thereof. Still further, the components and methods identified in the Background section are integral to this disclosure and can be used in conjunction with or substituted for components and methods described elsewhere in the disclosure within the scope of the invention.

What is claimed is:

1. A method for forming a single-layer or few-layer graphene film comprising:
    forming a graphene film having opposing surfaces, each with an area of at least 1 $cm^2$, on a surface of a growth substrate, wherein a majority of the graphene film has a thickness of 1 to 10 graphene layers;
    coating the graphene film on the growth substrate with a protective support layer;
    etching the surface of the growth substrate to release the graphene film and the protective support layer from the growth substrate, the protective support layer maintaining the integrity of the graphene film during and after its release from the growth substrate;
    applying the graphene film and protective support layer onto a target substrate after release from the growth substrate;
    removing the protective support layer from the graphene film by exposing the protective support layer to a solvent after the graphene film is applied to the target substrate; and
    using a liquid to float the graphene-film-coated protective support layer between release of the graphene and protective support layer from the growth substrate and application of the graphene and protective support layer to the target substrate.

2. The method of claim 1, wherein the growth substrate comprises a silica substrate or a silicon substrate coated with silica.

3. The method of claim 2, wherein the growth substrate further comprises a metal film on the silica coating, and wherein the graphene film is coated on the metal film.

4. The method of claim 3, wherein the metal film is deposited by electro-chemical deposition.

5. The method of claim 3, wherein the metal film comprises a metal selected from platinum, ruthenium, copper, nickel, and combinations thereof.

6. The method of claim 3, wherein the metal film comprises nickel.

7. The method of claim 3, wherein the metal film is a single crystal.

8. The method of claim 3, wherein the metal film is polycrystalline.

9. The method of claim 3, further comprising patterning the metal film via lithography.

10. The method of claim 3, further comprising covering part of the metal film surface to prevent graphene growth on the covered part and to produce a graphene pattern on the uncovered part of the metal film surface.

11. The method of claim 3, wherein the graphene film is released by removing the metal layer with an acidic etching solution.

12. The method of claim 11, wherein the etching solution comprises hydrochloric acid, nitric acid, or another chemical etchant of the metal.

13. The method of claim 3, further comprising producing grains with dimensions of at least 20 microns in the metal film.

14. The method of claim 13, wherein the metal grain sizes of at least 20 microns result in a majority of the graphene layer being single- or bi-layer.

15. The method of claim 13, wherein the metal grain sizes of at least 20 microns are formed by promoting growth of (111) grains.

16. The method of claim 15, further comprising depositing the metal at a temperature between 350° C. and 550° C. to promote the growth of (111) grains.

17. The method of claim 16, wherein the metal deposition temperature is about 450° C.

18. The method of claim 3, further comprising:
dissolving carbon into the metal film to form a solid solution; and
cooling the solid solution to precipitate the carbon as the graphene film.

19. The method of claim 18, wherein the solid solution is cooled at a rate of less than 25° C./minute.

20. The method of claim 19, wherein a majority of the resulting graphene film is single- or bi-layer.

21. The method of claim 1, wherein the graphene is deposited from a carbon source selected from methane, ethylene, alcohol, carbon monoxide, and combinations thereof.

22. The method of claim 21, wherein the carbon source is methane.

23. The method of claim 1, wherein the graphene is deposited via chemical vapor deposition.

24. The method of claim 1, wherein the protective support layer comprises polymethylmethacrylate.

25. The method of claim 1, further comprising:
generating patterns in the graphene via photolithography; and
removing patterned areas in the graphene by etching.

26. The method of claim 25, further comprising, after etching the graphene, doping an area of the graphene with a chemical to generate p- or n-type regions for devices.

27. The method of claim 26, wherein the chemical is selected from potassium, polyethyleneimine, and combinations thereof.

28. The method of claim 25, further comprising, after etching the graphene, intercalating a different molecule in the graphene.

* * * * *

UNITED STATES PATENT AND TRADEMARK OFFICE
CERTIFICATE OF CORRECTION

PATENT NO.         : 8,535,553 B2                                           Page 1 of 1
APPLICATION NO.    : 12/422747
DATED              : September 17, 2013
INVENTOR(S)        : Kong et al.

It is certified that error appears in the above-identified patent and that said Letters Patent is hereby corrected as shown below:

In the Claims

Claim 1, at Col. 10, line 24, the following phrase should read immediately after "coating the graphene film on the growth substrate with a protective support layer" and before the following ";":
--comprising a polymer--.

Signed and Sealed this
Twenty-fifth Day of February, 2014

Michelle K. Lee
*Deputy Director of the United States Patent and Trademark Office*